(12) United States Patent
Burr et al.

(10) Patent No.: US 8,298,896 B2
(45) Date of Patent: Oct. 30, 2012

(54) FORMATION OF A SUPER STEEP RETROGRADE CHANNEL

(76) Inventors: James B. Burr, Foster City, CA (US); Archisman Bagchi, San Jose, CA (US); Jawad Nasrullah, Palo Alto, CA (US)

( * ) Notice: Subject to any disclaimer, the term of this patent is extended or adjusted under 35 U.S.C. 154(b) by 0 days.

(21) Appl. No.: 13/214,593

(22) Filed: Aug. 22, 2011

(65) Prior Publication Data

US 2011/0300681 A1 Dec. 8, 2011

Related U.S. Application Data

(60) Division of application No. 12/715,262, filed on Mar. 1, 2010, now Pat. No. 8,003,471, which is a continuation of application No. 11/529,972, filed on Sep. 29, 2006, now Pat. No. 7,683,442.

(51) Int. Cl.
*H01L 21/336* (2006.01)

(52) U.S. Cl. ............... 438/282; 438/300; 257/E21.409

(58) Field of Classification Search .................. 438/297, 438/300, 305, 412; 257/297, 305, 412, E21.409
See application file for complete search history.

(56) References Cited

U.S. PATENT DOCUMENTS

| | | | |
|---|---|---|---|
| 5,553,008 A | 9/1996 | Huang et al. | |
| 5,719,422 A | 2/1998 | Burr et al. | |
| 5,837,587 A | 11/1998 | Wei | |
| 5,915,183 A | 6/1999 | Gambino et al. | |
| 6,180,468 B1 * | 1/2001 | Yu et al. | 438/297 |
| 6,201,761 B1 | 3/2001 | Wollesen | |
| 6,259,118 B1 | 7/2001 | Kadosh et al. | |
| 6,580,137 B2 | 6/2003 | Parke | |
| 6,881,987 B2 * | 4/2005 | Sohn | 257/192 |
| 7,153,732 B1 * | 12/2006 | Kim | 438/197 |
| 7,772,653 B1 | 8/2010 | Foote et al. | |
| 2003/0136982 A1 | 7/2003 | Rhodes | |
| 2006/0102958 A1 | 5/2006 | Masleid | |

* cited by examiner

*Primary Examiner* — Phuc Dang

(57) ABSTRACT

Systems and methods for raised source/drain with super steep retrograde channel are described. In accordance with a first embodiment, a semiconductor device comprises a substrate comprising a surface and a gate oxide disposed above the surface comprising a gate oxide thickness. The semiconductor device further comprises a super steep retrograde channel region formed at a depth below the surface. The depth is about ten to thirty times the gate oxide thickness. Embodiments may provide a more desirable body biasing voltage to threshold voltage characteristic than is available under the conventional art.

20 Claims, 5 Drawing Sheets

100

300

FORMATION OF A SUPER STEEP RETROGRADE CHANNEL

CROSS-REFERENCE TO RELATED APPLICATIONS

This application is a Divisional of and claims priority to U.S. patent application Ser. No. 12/715,262, filed on Mar. 1, 2010 and now issued as U.S. Pat. No. 8,003,471, which is a Continuation of and claims priority to U.S. patent application Ser. No. 11/529,972, filed on Sep. 29, 2006 and now issued as U.S. Pat. No. 7,683,442, which are hereby incorporated by reference in their entirety.

FIELD

Embodiments relate to the field of design and construction of semiconductor devices. More specifically, embodiments relate to systems and methods for design and construction of semiconductor devices comprising raised source/drain regions in conjunction with super steep retrograde channels.

BACKGROUND

It is sometimes desirable to adjust a threshold voltage of a semiconductor device, e.g., to increase and/or decrease such threshold voltage, in a post-manufacturing environment, in response to changing operating conditions of the semiconductor device. For example, adjustment of threshold voltage via application of a body biasing voltage may be useful to adjust for manufacturing process, voltage and/or thermal variation, as well as to adjust for changing performance requirements in a semiconductor device.

SUMMARY

Therefore, a need exists for systems and methods for design and construction of semiconductor devices comprising raised source/drain regions in conjunction with super steep retrograde channels. A need also exists for improving a relation between a body biasing voltage and a threshold voltage for a semiconductor device that also satisfies the above need. A further need exists for systems and methods for design and construction of semiconductor devices comprising raised source/drain regions in conjunction with super steep retrograde channels that are compatible and complementary with existing semiconductor design and manufacturing techniques, as well as existing methods of post-manufacturing threshold voltage control.

Accordingly, in one embodiment, a semiconductor device comprises a substrate comprising a surface and a gate oxide disposed above the surface comprising a gate oxide thickness. The semiconductor device further comprises a super steep retrograde channel region formed at a depth below the surface. In one embodiment, the depth is about ten to thirty times the gate oxide thickness.

In accordance with another embodiment, a semiconductor device comprises a substrate having a substrate thickness and a source structure disposed above the substrate having a source thickness. The substrate thickness is sufficient to accommodate the source thickness.

In accordance with still another embodiment, a semiconductor device comprises a super steep retrograde channel region and a raised source structure.

BRIEF DESCRIPTION OF THE DRAWINGS

The accompanying drawings, which are incorporated in and form a part of this specification, illustrate embodiments, together with the description, serve to explain the principles of the disclosure. Unless otherwise noted, the figures are not drawn to scale.

DETAILED DESCRIPTION

Reference will now be made in detail to embodiments, examples of which are illustrated in the accompanying drawings. While the disclosure will be described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description, numerous specific details are set forth in order to provide a thorough understanding. However, it will be recognized by one of ordinary skill in the art that embodiments may be practiced without these specific details.

Raised Source/Drain with Super Steep Retrograde Channel

It is sometimes desirable to adjust a threshold voltage of a semiconductor device, e.g., to increase and/or decrease such threshold voltage, in a post-manufacturing environment, in response to changing operating conditions of the semiconductor device. For example, a relatively lower threshold voltage generally provides a higher maximum frequency of operation for the semiconductor device. Unfortunately, such a lower threshold voltage also generally increases static current leakage of the semiconductor device. Consequently, beneficial decreases in static current consumption may be achieved by increasing threshold voltage in situations in which a relatively lower maximum frequency of operation is acceptable. It is also appreciated that adjustment of threshold voltage via application of a body biasing voltage may be useful to adjust for manufacturing process induced, voltage induced and/or thermally induced threshold voltage variations in a semiconductor.

One method to adjust the threshold voltage of a semiconductor device is to apply a body biasing voltage to the body of the semiconductor device. Changes to such a body biasing voltage generally change the threshold voltage of the semiconductor device.

Figure 1:
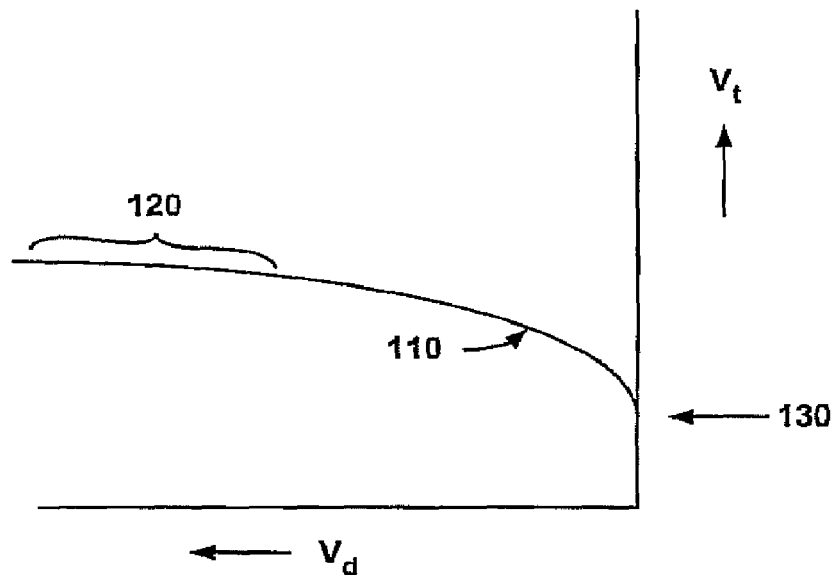
FIG. 1 illustrates an exemplary plot of threshold voltage versus body bias voltage in a typical semiconductor device, in accordance with the conventional art.

FIG. 1 illustrates an exemplary plot 100 of threshold voltage versus body bias voltage in a typical semiconductor device, in accordance with the conventional art. The vertical axis indicates threshold voltage and the horizontal axis indicates body biasing voltage. Point 130 indicates an initial threshold voltage for zero applied body bias voltage. The initial threshold voltage may be determined by many well known factors, including the channel doping.

Curve 110 generally indicates that changes to body bias voltage will produce a change to threshold voltage of the semiconductor device. However, as body bias voltage is applied, the depletion region of the channel will grow, and a charge summing effect occurs. Consequently, as the magnitude of body bias voltage increases, it becomes necessary to apply ever greater magnitudes of body bias voltage to obtain ever smaller changes in threshold voltage. This is depicted in region 120 of curve 110.

Figure 2A:
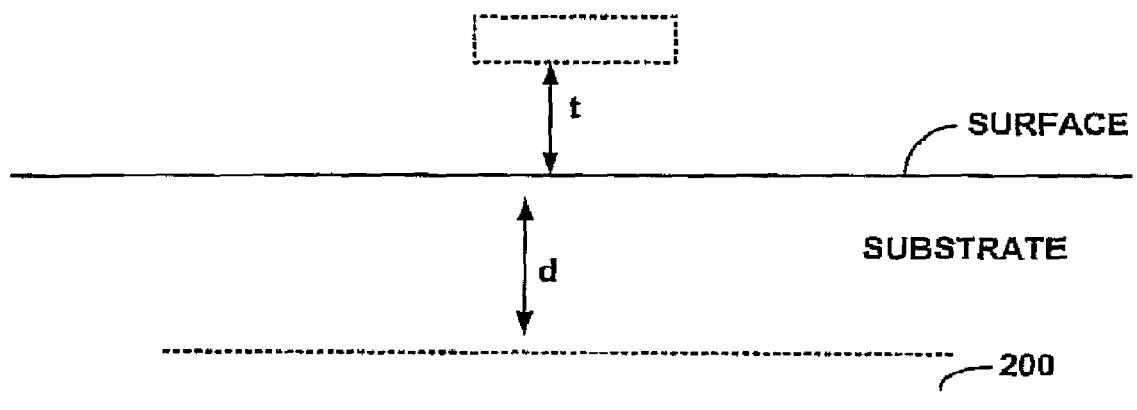
FIG. 2A illustrates a side sectional view of an exemplary super steep retrograde channel region, in accordance with embodiments.

FIG. 2A illustrates a side sectional view of an exemplary super steep retrograde channel region 200, in accordance with embodiments. Region 200 is formed, e.g., by implanting Indium or Boron at high energy, at a distance "d" below the substrate surface, in contrast to a more typical channel region which is formed at or near the surface of a substrate. In addition, the dopant concentration in region 200 increases with depth, in contrast to a more typical channel region in which dopant concentration decreases with depth into the substrate. This is generally known as or referred to as a "retrograde" channel doping profile. Further, region 200 is characterized as having a very, or "super" steep change in dopant concentration. The term "super steep" is a term of art, well understood by practitioners of the semiconductor arts. For example, a "super steep" change in dopant concentration attempts to approximate a step function.

Figure 2B:
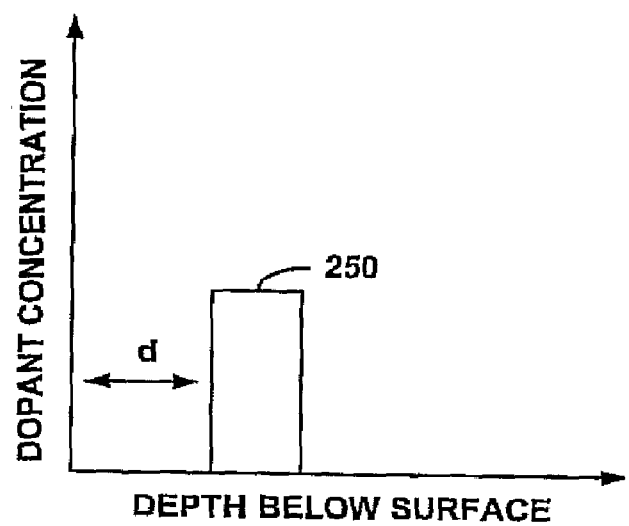
FIG. 2B illustrates a doping profile for a channel region, in accordance with embodiments.

FIG. 2B illustrates a doping profile 250 for channel region 200, in accordance with embodiments. The horizontal axis indicates depth below the substrate surface, while the vertical axis indicates dopant density. It is appreciated that doping profile 250 is idealized, and that such sharp changes in dopant density as illustrated are typically not achievable in real structures.

Figure 3:
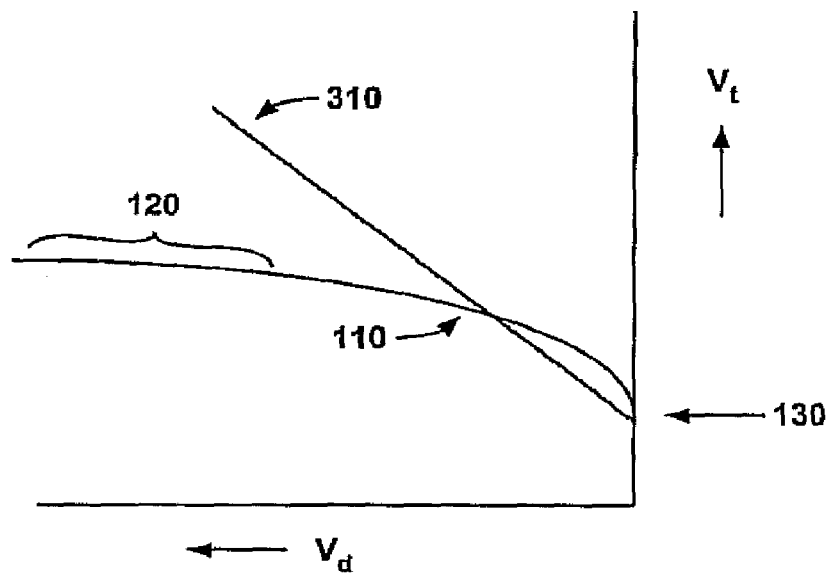
FIG. 3 illustrates an exemplary plot of threshold voltage versus body bias voltage in a semiconductor device comprising super steep retrograde channel region, in accordance with embodiments.

FIG. 3 illustrates an exemplary plot 300 of threshold voltage versus body bias voltage in a semiconductor device comprising super steep retrograde channel region 200, in accordance with embodiments. The vertical axis indicates threshold voltage and the horizontal axis indicates body biasing voltage.

In contrast to a conventional art semiconductor device as illustrated in FIG. 1, a depletion region due to applied body bias only grows until it impacts the upper edge of super steep retrograde channel region 200 (FIG. 2A). Consequently, threshold voltage versus body bias voltage curve 310 for a semiconductor device comprising a super steep retrograde channel, e.g., super steep retrograde channel 200, is much more linear. As a beneficial result, threshold voltage in a semiconductor device comprising a super steep retrograde channel may generally be adjusted over a wider range, and such adjustment generally results from smaller changes in body biasing voltage, in comparison to the conventional art channels.

Referring once again to FIG. 2A, a number of factors, including a desire to prevent punch-through and to optimize a body biasing voltage versus threshold voltage characteristic, e.g., curve 310 of FIG. 3, influence the depth of super steep retrograde channel 200.

In stacked gates, e.g., NAND and/or NOR gates, devices in the middle of the stack are typically neither grounded nor completely pulled up to Vdd. Consequently, such devices are intrinsically subjected to a body bias. For example, their source and/or drain terminals are at voltages other than Vdd or ground. Thus, it is generally desirable to have a low response to an extrinsically applied body biasing voltage, so as to not overly compound the intrinsic body effect.

In a contrary manner, it is desirable to have a high response to an extrinsically applied body biasing voltage to enable a wide range of threshold voltage adjustments, e.g., for performance, manufacturing process, voltage and/or thermal variation reasons.

In accordance with embodiments, it is desirable for a one unit change in body biasing voltage to adjust threshold voltage by about $\frac{1}{10}$ to $\frac{1}{3}$ of a unit. For example, a one volt change in body bias voltage produces about a 100 to 333 millivolt change in threshold voltage. This range has proven to be a beneficial compromise between the competing influences affecting a body biasing voltage versus threshold voltage characteristic. It is to be appreciated that smaller changes in threshold voltage, e.g., a 50 mV threshold voltage change per 1 volt body bias change, are well suited to embodiments.

For example, in accordance with embodiments, depth "d" (FIG. 2A) is ten to 30 times a gate oxide thickness for a given semiconductor manufacturing process. Such a range of depths supports a body biasing voltage versus threshold voltage characteristic as described previously.

It is to be appreciated that a conventional source/drain region is typically implanted and heavily doped to a depth greater than ten to 30 times a gate oxide thickness. For example, most source/drain regions comprise a silicide structure, the formation of which consumes silicon in the source/drain region. Such silicide generally requires a deepening of a source/drain region. In addition, achieving a desirably low contact resistance between the silicide and diffusion generally also requires a relatively deeper source/drain region. Further, it is generally difficult to form a source/drain region of less than about 30 times a gate oxide thickness, e.g., for reasons of implant energy, thermal diffusion and/or desirably low source/drain to channel capacitance.

For example, a conventional semiconductor may comprise gate oxides that are typically about 2 nm thick. Bulk source/drain structures may typically extend to a depth of 100 nm or more. Conventional source/drain extensions may extend to a depth of 50 nm. Consequently, conventional source/drain regions typically extend to a depth of 50 or more times a gate oxide thickness.

Unfortunately, a heavily doped super steep retrograde channel, e.g., channel 200 of FIG. 2A, formed at a desirably shallow depth, tends to overlap and/or create a junction between the super steep retrograde channel and a conventional source/drain region. For example, conventional source/drain regions are typically implanted and heavily doped to a depth greater than a desirable depth of the heavily doped super steep retrograde channel. Such a junction between a super steep retrograde channel and a source/drain region may frequently be known as an "abrupt" junction.

Such a junction is generally structurally a reverse-biased junction. However, under conditions of an applied body biasing voltage, the voltage across such a junction may cause band-to-band tunneling resulting in reverse-bias junction leakage. Such biasing conditions at such junctions are generally deleterious to the function of a semiconductor device.

In accordance with embodiments, a raised source/drain may provide the necessary thickness of material to form a satisfactory source/drain, e.g., thick enough to provide for a desirable silicide and advantageously low contact resistance, while providing clearance, e.g., not overlapping, a super steep retrograde channel placed at an advantageous depth.

At present semiconductor process geometries, e.g., for processes with a critical dimension of about 0.13 μm and less, a raised source/drain structure generally results in an undesirably high gate to source/drain capacitance. A combination of contact size requirements and other design rules generally cause the gate-side edge of a raised source/drain structure to be substantially parallel to a gate edge, resulting in a deleteriously high gate to source/drain capacitance. Consequently, most proposals for use of raised source/drain structures are found in ultra thin silicon on insulator (SOI) applications. For example, applications in which a very thin substrate, e.g., a substrate of 10-20 nm in total thickness, generally is unable to accommodate a convention source/drain implanted into the substrate. As a result, a source/drain must be formed outside of the substrate, e.g., on or in raised or elevated structures above the substrate.

In accordance with embodiments, a raised source/drain is formed above a substrate that is otherwise thick enough to accommodate a source/drain while complying with the process design rules.

Figure 4A:
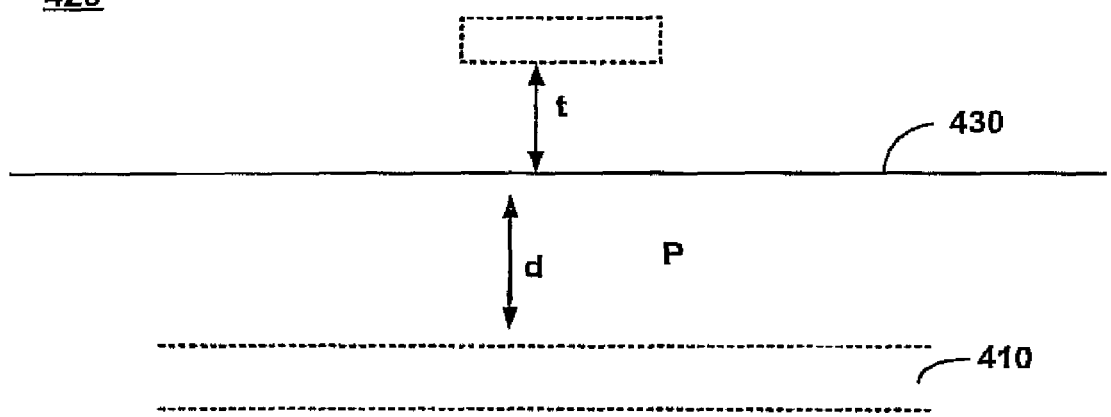
FIGS. 4A, 4B, 4C, 4D and 4E illustrate formation of a semiconductor device comprising a super steep retrograde channel with raised source/drain, in accordance with embodiments.

FIGS. 4A-4E illustrate a formation of a semiconductor device comprising a super steep retrograde channel with raised source/drain, in accordance with embodiments. In FIG. 4A, a super steep retrograde channel region 410 is formed in substrate 420, beginning at a depth "d" beneath surface 430 of substrate 420. In one embodiment, depth "d" may be in a range of ten to 30 times dimension "t," the eventual thickness of a gate oxide layer. It is appreciated that a gate typically has not been formed at a point in a semiconductor manufacturing process advantageous for the formation of region 410.

Channel region 410 may be formed by a variety of well-known processes, including, for example, high energy implantation of Indium. As illustrated, substrate 420 is P-type material, and super steep retrograde channel region 410 is heavily doped P-type material. Region 410 is typically not so heavily doped as to become degenerate P+ material. It is appreciated that well known symmetries between N and P type materials exit. Consequently, embodiments are well suited to formation in N type substrates, and such embodiments are considered within the scope of the disclosure.

Figure 4B:
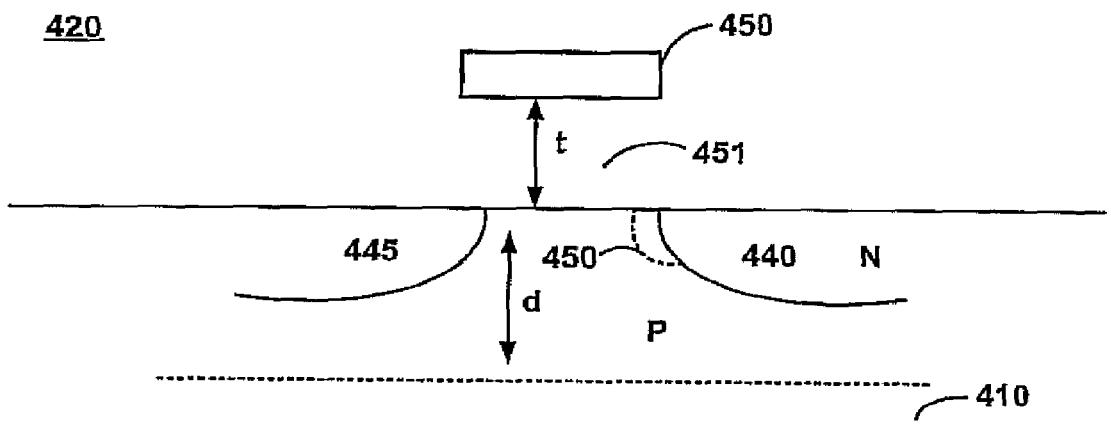

FIG. 4B illustrates the formation of shallow source extension 440 and shallow drain extension 445, in accordance with embodiments. Gate 450 and gate oxide 451 are also illustrated. Shallow source extension 440 and shallow drain extension 445 are formed in substrate 420 to a depth such that their function is not impacted by region 410. The depth of shallow source/drain extension 440, 445, is generally less, e.g., "shallower," than the depth of conventional source/drain extensions. Optionally, an asymmetric lightly doped halo, or "punch-through stop," 450 may be formed on shallow source 440.

Figure 4C:
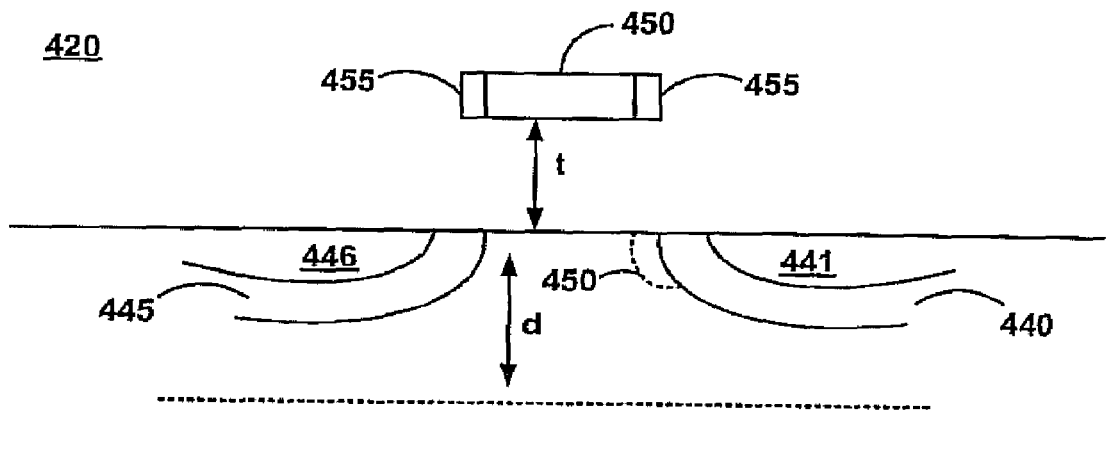

FIG. 4C illustrates formation of spacers 455 on gate 450, in accordance with embodiments. Spacers 455 form a barrier for insulating the raised source/drain from the gate 450.

Figure 4D:
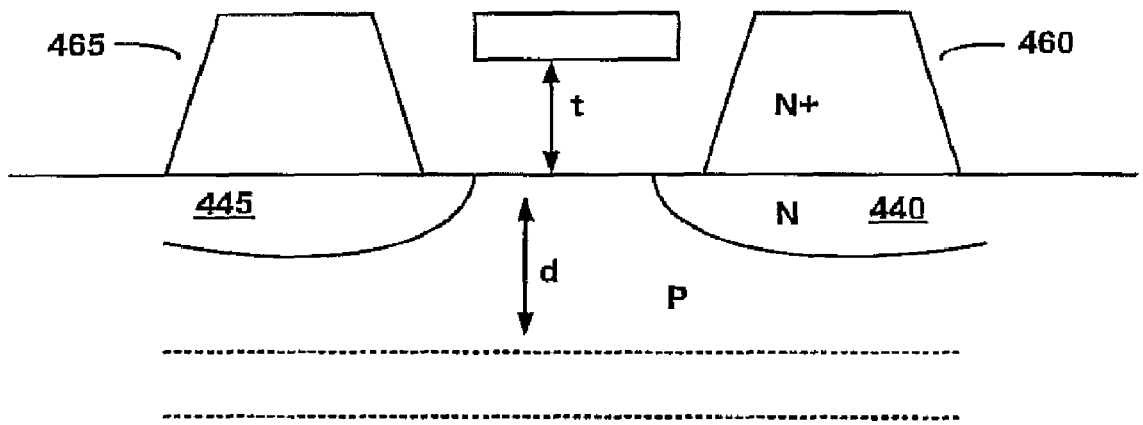

FIG. 4D illustrates formation of raised or elevated source region 460 and raised drain region 465, in accordance with embodiments. Raised source/drain regions 460, 465 may be formed by a variety of well-known processes, including selective epitaxial growth.

In this novel manner, a semiconductor device is provided that provides a beneficial capability to adjust threshold voltage by application of a body biasing voltage. A relatively shallow super steep retrograde channel, e.g., region 410, enables a more desirable body biasing voltage to threshold voltage characteristic, while raised source/drain regions provide source/drain functionality absent detrimental impact by the shallow super steep retrograde channel.

Figure 4E:
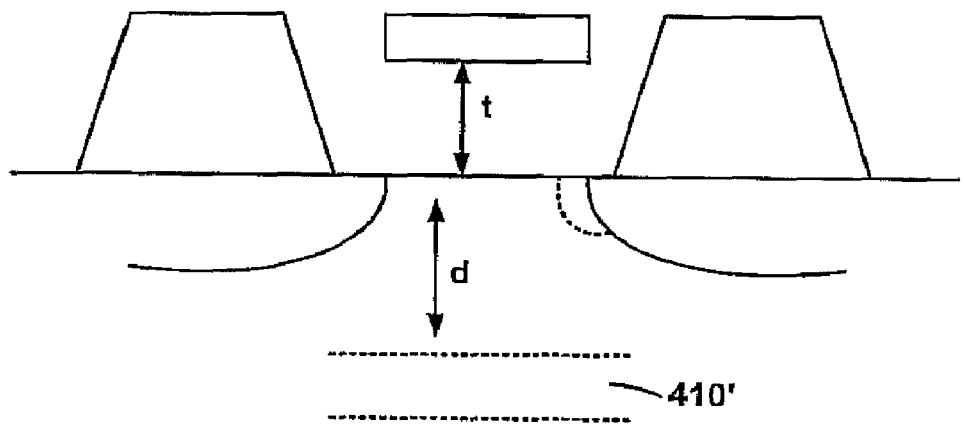

FIG. 4E illustrates an alternative embodiment. In FIG. 4E, super steep retrograde channel 410' is formed via a masked implant such that its lateral extent is substantially limited to beneath the actual channel. For example, as shown in the view of FIG. 4E, the length of channel 410' is approximately the distance between a source and a drain. In this novel manner, junction capacitance between super steep retrograde channel 410' and a source/drain is beneficially reduced.

Embodiments provide for systems and methods for design and construction of semiconductor devices comprising raised source/drain regions in conjunction with super steep retrograde channels. Embodiments also provide for improving a body biasing voltage to threshold voltage relation for a semiconductor device. Further, embodiments provide for systems and methods for design and construction of semiconductor devices comprising raised source/drain regions in conjunction with super steep retrograde channels that are compatible and complementary with existing semiconductor design and manufacturing techniques, as well as existing methods of post-manufacturing threshold voltage control.

The foregoing descriptions of specific embodiments have been presented for purposes of illustration and description. They are not intended to be exhaustive or to limit the disclosure to the precise forms disclosed, and many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is intended that the scope of the disclosure be defined by the Claims appended hereto and their equivalents.

What is claimed is:

1. A method comprising:
   forming a super steep retrograde channel region at a depth below a surface of a substrate;
   forming a gate oxide layer on the surface of the substrate, wherein the depth is a product of a number and a thickness of the gate oxide layer; and
   forming a structure on the surface of the substrate and adjacent to the gate oxide layer.

2. The method of claim 1, further comprising:
   forming a gate on the gate oxide layer, wherein the structure is located adjacent to the gate oxide layer and the gate.

3. The method of claim 2, wherein the depth is at least 10 times the thickness of the gate oxide layer.

4. The method of claim 2, wherein the depth is less than 30 times the thickness of the gate oxide layer.

5. The method of claim 1, wherein the structure comprises epitaxially-grown material.

6. The method of claim 1, wherein the structure comprises silicide.

7. The method of claim 1, wherein said forming the super steep retrograde channel region comprises:
   using a masked implant.

8. A method comprising:
   forming a super steep retrograde channel region at a depth below a surface of a substrate;
   forming a gate oxide layer on the surface of the substrate, wherein the depth is a product of a number and a thickness of the gate oxide layer; and
   forming a source structure on the surface of the substrate and adjacent to the gate oxide layer.

9. The method of claim 8, wherein the source structure comprises epitaxially-grown material.

10. The method of claim 8, wherein the source structure comprises silicide.

11. The method of claim 8, further comprising:
    forming a spacer to insulate the source structure from a gate.

12. The method of claim 8, further comprising:
forming a source extension within the substrate and beneath the source structure.

13. A method comprising:
forming a super steep retrograde channel region at a depth below a surface of a substrate;
forming a gate oxide layer on the surface of the substrate, wherein the depth is a product of a number and a thickness of the gate oxide layer; and
forming a plurality of raised structures on the surface of the substrate and adjacent to the gate oxide layer.

14. The method of claim 13, further comprising:
forming a gate on the gate oxide layer, wherein a first raised structure of the plurality of raised structures is located on a first side of the gate oxide layer and the gate, wherein a second raised structure of the plurality of raised structures is located on a second side of the gate oxide layer and the gate, and wherein the first side and the second side are opposite sides.

15. The method of claim 14, wherein the depth is at least 10 times the thickness of the gate oxide layer.

16. The method of claim 14, wherein the depth is less than 30 times the thickness of the gate oxide layer.

17. The method of claim 13, wherein the plurality of raised structures comprise epitaxially-grown material.

18. The method of claim 13, wherein the plurality of raised structures comprise silicide.

19. The method of claim 13, wherein the plurality of raised structures comprise a raised source structure.

20. The method of claim 13, wherein the plurality of raised structures comprise a raised drain structure.

* * * * *

UNITED STATES PATENT AND TRADEMARK OFFICE
CERTIFICATE OF CORRECTION

PATENT NO. : 8,298,896 B2  
APPLICATION NO. : 13/214593  
DATED : October 30, 2012  
INVENTOR(S) : Burr et al.

Page 1 of 1

It is certified that error appears in the above-identified patent and that said Letters Patent is hereby corrected as shown below:

In the Specifications:

In Column 2, Line 37, delete "Raised Source/Drain with Super Steep Retrograde Channel".

Signed and Sealed this  
Thirtieth Day of April, 2013

Teresa Stanek Rea  
*Acting Director of the United States Patent and Trademark Office*